United States Patent
Leschka et al.

(10) Patent No.: US 11,611,829 B2
(45) Date of Patent: Mar. 21, 2023

(54) DEVICE AND METHOD FOR SUPPLYING POWER

(71) Applicant: Sennheiser electronic GmbH & Co. KG, Wedemark (DE)

(72) Inventors: Stephan Leschka, Potsdam (DE); Johannes Storch, Wedemark (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 0 days.

(21) Appl. No.: 17/213,368

(22) Filed: Mar. 26, 2021

(65) Prior Publication Data
US 2021/0306750 A1    Sep. 30, 2021

(30) Foreign Application Priority Data
Mar. 31, 2020    (DE) .................. 102020108855.8

(51) Int. Cl.
*H04R 5/04* (2006.01)
*H03F 1/02* (2006.01)
(Continued)

(52) U.S. Cl.
CPC ............. *H04R 5/04* (2013.01); *H03F 1/0227* (2013.01); *H03F 2200/03* (2013.01)

(58) Field of Classification Search
None
See application file for complete search history.

(56) References Cited

U.S. PATENT DOCUMENTS

| 2007/0236974 A1 | 10/2007 | Noro | |
|---|---|---|---|
| 2009/0016549 A1* | 1/2009 | French | H03G 3/004 |
| | | | 323/299 |

(Continued)

FOREIGN PATENT DOCUMENTS

| EP | 1 845 600 | 2/2014 |
|---|---|---|
| EP | 3 509 202 | 7/2019 |

(Continued)

OTHER PUBLICATIONS

Extended European Search Report dated Jul. 23, 2021 for application No. 21 16 3885.

(Continued)

*Primary Examiner* — Qin Zhu
(74) *Attorney, Agent, or Firm* — Haug Partners LLP (57) ABSTRACT

Power supply units e.g. in network operated loudspeakers are tailored to peak values that are reached only relatively rarely and then in pulses. With an intermediate storage of electrical energy in an intermediate circuit energy storage element it is possible to provide a significantly higher amount of power at least for a short period of time. The intermediate circuit energy storage element may be a capacitor or accumulator, for example, which is connected to an intermediate circuit voltage that is higher than the input voltage, and that is generated by an upconverter. A downconverter generates the output voltage of the power supply unit from the energy stored in the intermediate circuit storage element. The output voltage of the power supply unit is used as power supply for an audio amplifier. The power supply unit may provide for a short period of time a higher current or more energy respectively than the actual energy source, for example the network node. Correspondingly, the device operated with the output voltage of the power supply unit, for example the audio amplifier, can have a significantly higher effective power than previously possible for the short period of time.

17 Claims, 7 Drawing Sheets

(51) Int. Cl.
*H02M 3/155* (2006.01)
*H02M 3/156* (2006.01)
*H02M 1/00* (2006.01)
*H02J 7/34* (2006.01)

(56) References Cited

U.S. PATENT DOCUMENTS

| | | | | |
|---|---|---|---|---|
| 2015/0200640 | A1* | 7/2015 | Hogan | H03G 3/004 |
| | | | | 381/108 |
| 2017/0201099 | A1 | 7/2017 | Savanti et al. | |
| 2019/0067958 | A1* | 2/2019 | Zimnicki | H02J 7/022 |
| 2019/0312741 | A1* | 10/2019 | Chen | H03F 3/2171 |
| 2020/0303944 | A1* | 9/2020 | Jonsson | H01M 10/48 |
| 2021/0376796 | A1* | 12/2021 | Millyard | H03F 3/183 |

FOREIGN PATENT DOCUMENTS

| | | |
|---|---|---|
| WO | WO 2007/082388 | 7/2007 |
| WO | WO 2018/005895 | 1/2018 |

OTHER PUBLICATIONS

German Search Report for Application No. 102020108855.8 dated Mar. 9, 2021.

* cited by examiner

DEVICE AND METHOD FOR SUPPLYING POWER

CROSS REFERENCE TO RELATED APPLICATION(S)

This application claims the benefit of the foreign priority of German Patent Application No. 10 2020 108 855.8, filed on Mar. 31, 2020, the entirety of which is incorporated herein by reference.

FIELD OF DISCLOSURE

The invention relates to a device for supplying power, in particular from a limited energy source. The invention also relates to a loudspeaker with a corresponding device and to a method for supplying power, in particular from a limited energy source.

BACKGROUND

Modern device connection aims at a minimization of the cabling required. Therefore, cables that were originally meant for information transmission are also used for power supply. An example is a DC voltage that is transmitted over a local network in order to supply power to connected devices (power over Ethernet, PoE). In a network with a star topology, a network node (switch) supplies each connected device with power.

Figure 1:
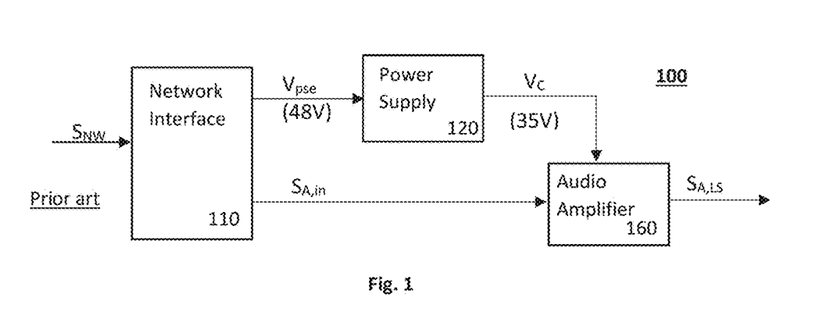

Loudspeakers (i.e. loudspeaker boxes) today have usually an audio input and a separate power supply. Especially if the loudspeaker is connected to a digital audio network, it can be supplied with power from the switch via PoE. An advantage is that only the CAT5/6/x network cables need to be laid when installing the loudspeaker, while a separate power supply for each loudspeaker is not necessary. FIG. 1 shows a block diagram 100 of a loudspeaker that is operated on a network by means of PoE. In a network interface unit 110, the network signal $S_{NW}$ received via the network cable is split into a DC voltage $V_{pse}$ (48V) for power supply and an audio signal $S_{A,in}$ to be reproduced. In a power supply unit 120, the DC voltage $V_{pse}$ is transformed into a (usually lower) voltage, e.g. 35V, that is used as operating voltage $V_C$ for an audio amplifier 160. The audio amplifier 160 amplifies the audio signal $S_{A,in}$ to be replayed and generates the audio output signal $S_{A,LS}$ that is provided to the actual loudspeaker or transducer, respectively (not shown).

Figure 2:
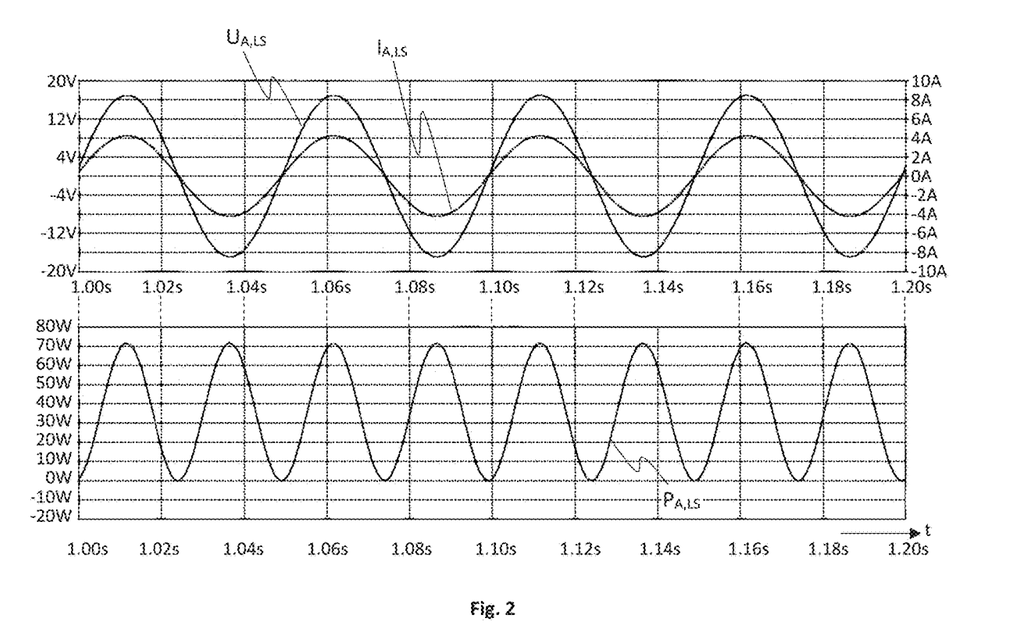
FIG. 2 shows voltage, current and power curves of a sinusoidal signal on a resistive consumer (load)

However, PoE is an energy source which is limited in terms of current and thus in terms of power. For example, it may provide a current of up to 1.92 A, not more. FIG. 2 shows voltage, current and power of a sinusoidal (audio) signal on a resistive load. The momentary value of the power $P_{A,LS}$ as being the product of voltage $U_{A,LS}$ and current $I_{A,LS}$ oscillates at double frequency around a temporal mean value. The effective power as being the temporal mean value or the RMS (root-mean-square) power corresponds to half the peak power. With today's standard digital full bridge output stage, the load is connected via a non-symmetric supply voltage. Therefore, with an idealized efficiency of 100%, the peak voltage at the low-pass filtered output of the output stage corresponds to the supply voltage. In the case of a power supply via PoE with 1.92 A/48V and considering the permissible line losses, a peak power of 71 W can be provided to the terminal device.

This peak power is fully exploited by feeding a 4 Ohms load resistor, which a loudspeaker typically constitutes, after converting the supply voltage to 17V by means of an interposed downconverter. The effective power (root-mean-square or RMS power) of the loudspeaker is therefore limited to 36 W for distortion-free operation and sinusoidal signals.

The limitation to such low electrical peak power values and the consequently very limited maximum sound pressure level pose a problem for example for studio monitors. It would be desirable to be able to provide a higher pulse power than the above-determined effective power to network operated devices, in particular to loudspeaker boxes.

Further, in reality the load is often not resistive but inductive and frequency-dependent, for example in the case of loudspeakers. This means that the phase of the current is shifted relative to the voltage and the amount of power that is actually consumed is not easy to determine. It is thus also desirable to enable a simple and still exact measurement of the utilized power.

SUMMARY OF THE INVENTION

The above-mentioned objects may be solved by a device according to claim 1. Claim 13 discloses a corresponding method for supplying power.

The invention is based on the recognition of the fact that the dimensioning of power supply units, particularly for network operated loudspeakers, is tailored to peak values that are reached relatively rarely and then usually in pulses. This may also apply to other devices, not only audio amplifiers or loudspeakers. According to the invention, significantly more power may be provided, at least for a short time such as for example for impulses, by intermediately storing electrical energy in an energy storage element of an intermediate circuit. This intermediate circuit energy storage element may be, for example, a capacitor or an accumulator operated at an intermediate circuit voltage that is higher than the input voltage. The output voltage of the power supply unit that is used as supply voltage for the audio amplifier may be lower than the voltage supplied by the network, and it is generated from the energy stored in the energy storage element of the intermediate circuit. The power supply unit may deliver for a short time period more power, or a higher current respectively, than the actual energy source could deliver, for example the network or network node. Correspondingly, the device supplied with the output voltage of the power supply unit, for example the audio amplifier, may have a significantly higher effective power than previously possible. In other words, a pulse power which is required only occasionally can be intermediately stored in a device such as for example a loudspeaker. This allows operating the device at an energy source that has considerably lower continuous supply power capabilities. A further advantage is that a precise and very simple way of power measurement is made possible.

In an embodiment, the intermediate circuit voltage is at least twice the input voltage. In another embodiment, the intermediate circuit voltage is at least four times the input voltage. In an embodiment, the short time period is between 100 ms (milliseconds) and 200 ms. In another embodiment, the short time period may be between 100 ms and 800 ms.

Further advantageous embodiments are disclosed in the following detailed description and in the dependent claims.

BRIEF DESCRIPTION OF THE DRAWINGS

Further details and advantageous embodiments are depicted in the drawings, which show in FIG. 1 shows a block diagram of a network operated loudspeaker powered by means of PoE.

DETAILED DESCRIPTION OF PREFERRED EMBODIMENTS

The invention can be used in a variety of different devices that receive their supply voltage from a power-limited or current-limited energy source. An example is an improved active loudspeaker box that is adapted for receiving its supply power from a (data) network, such as a local area network (LAN) according to IEEE802.3x or Ethernet. This means that no separate power supply is required for the loudspeaker box. Thus, less cabling is required, which is an advantage particularly for arrangements of a plurality of such loudspeaker boxes. It is noted that the term loudspeaker herein usually relates to a loudspeaker box, including an amplifier and other circuitry therein, rather than to the actual sound transducer, unless otherwise stated.

Figure 3:
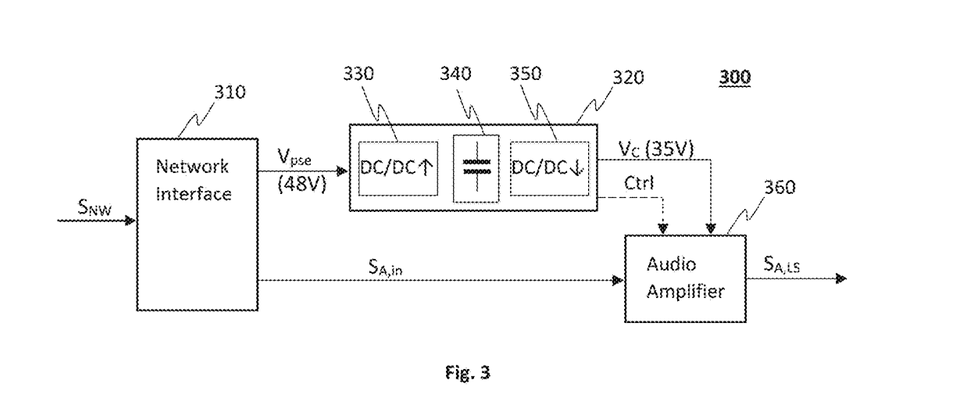
FIG. 3 shows a block diagram of a network operated loudspeaker, according to an embodiment.

FIG. 3 shows a block diagram of a network operated loudspeaker, in an embodiment. The loudspeaker 300 comprises a network interface 310 through which it receives a network signal $S_{NW}$, for example over one or more different wires of a network cable. The network signal $S_{NW}$ is split into an audio signal $S_{A,in}$ and a supply power signal $V_{PSE}$. The audio signal is provided to an audio amplifier 360 that is operated with an operating voltage $V_C$ which is obtained from the supply power signal $V_{PSE}$. For example, the supply power signal $V_{PSE}$ has a voltage of 48V in the case of PoE. Instead of converting this voltage directly down to the operating voltage $V_C$ of e.g. 35V, as usual, it is transformed in a power supply unit 320 first into a significantly higher intermediate circuit voltage $V_{DCL}$. For this purpose, the power supply unit 320 comprises an upconverter or boost converter 330. An energy storage element 340 is charged with the intermediate circuit voltage $V_{DCL}$. The upconverter only poses a load on the network that is within the permissible limits. That is, the values that are specified as permissible for the network, in particular the maximum current and power, are adhered to. The energy storage element 340 may be charged up to the intermediate circuit voltage $V_{DCL}$.

A downconverter or buck converter 350 transforms the intermediate circuit voltage $V_{DCL}$ down to the required supply voltage $V_C$. The downconverter 350 may be a switching regulator, such as a known voltage converter. For loudspeakers, it is also possible to perform the downconversion directly by pulse width modulation (PWM), for example using the PWM output stages. In one embodiment, the downconverter may also implement an isolation (i.e., a separation of potentials) in order to keep the high voltage of the power supply unit 320 away from the consumer or amplifier 360, respectively. For the sake of completeness, it is noted that the loudspeaker 300 will also comprise at least one transducer (not shown) that is fed by the audio output signal $S_{A,LS}$ of the amplifier 360.

An advantage results from the fact that the power provided at the output of the power supply unit 320 to the consumer or amplifier 360, at least above a certain power level, is not drawn directly from the power limited energy source (i.e., the input signal $S_{NW}$ and thus the network), but from the energy storage element 340. The threshold for drawing power from the energy storage element 340 may correspond to the maximum power that can be drawn from the network or generally from the power-limited source, or it may be lower. For providing more energy over a short time period (i.e., an impulse), the portion of energy that is beyond the amount provided by the power-limited energy source is drawn from the energy storage element 340, while the power-limited energy source is still only loaded with the permissible amount of power. On average over time, however, the amount of energy supplied to the consumer is lower than the amount of energy that the power-limited energy source may deliver. The energy difference, i.e. the additional energy that the energy source can deliver, may therefore be used to recharge the energy storage element 340 very quickly after a discharge.

Since the energy storage element 340 constitutes a DC based link between the generated (i.e. upconverted) intermediate circuit voltage and the intermediate circuit voltage being output, it is also referred to as DC-link herein.

The energy stored in the power supply unit 320 or in the terminal device, respectively, and thus the additionally available pulse power, depends on the capacity $C_{DCL}$ of the energy storage element 340 and on the voltage difference between the output voltage $V_C$ and the intermediate circuit voltage $V_{DCL}$. The maximum output current of the power supply unit 320 together with the current charging voltage $V_{DCL}$ determines the maximum momentary power available from the power supply unit, which is significantly above that of the power-limited energy source.

The downconverter 350, for example a switching regulator, now discharges the energy storage element 340 in the case of a high pulse power. The discharge results in a lower intermediate circuit voltage $V_{DCL}$, possibly down to the level of the supply voltage $V_C$ that the consumer needs or even a lower voltage level, depending on the regulator type. This may be the case if an inverse converter, SEPIC or Buck-/Boost-converter is used at the output side, for example. Optionally, the power supply unit 320 may generate a control signal Ctrl as described below.

Figure 4:
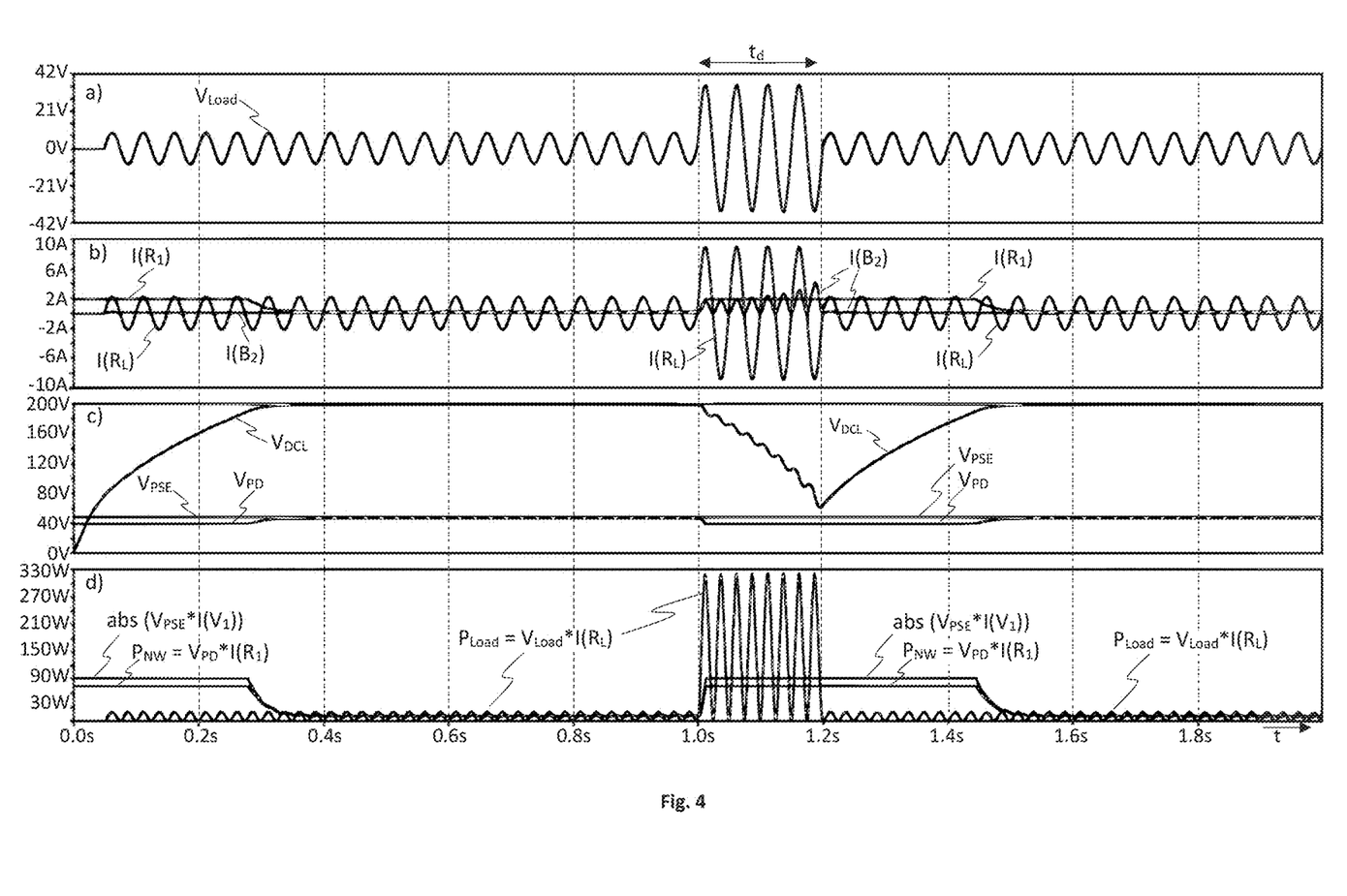
FIG. 4 shows voltage and current curves in, and power provided by, a power supply unit, according to an embodiment.

FIG. 4 shows voltage curves and current curves within the power supply unit 320 while replaying a sinusoidal signal, as well as a curve of the power provided to the audio amplifier 360 and to the loudspeaker (i.e. transducer) connected to it. The power supply unit 320 is provided with power from the network via PoE. The supply voltage $V_{PSE}$ is constantly 48V. FIG. 4a) shows the AC voltage $V_{Load}$ at the transducer. It is initially in the range of ±10V, but at t=1.0 s changes to ±30V for a duration of 200 ms and then back to the previous range. FIG. 4b) shows the current $I(R_L)$ through a resistive load, which in a range of about ±2 A also follows a sinusoidal signal and, starting at t=1.0 s, increases to values in a range of about ±9 A for a duration of 200 ms. The resulting power $P_{Load}=V_{Load}*I(R_L)$ is shown in FIG. 4d). It first remains below 30 W, but increases at t=1.0 s for 200 ms to a very high value of about 162 W (effective) or 324 W (peak) respectively. Thus, for a time interval of $t_d$=200 ms, an increase of the output power is achieved roughly by a factor of 4.5 relative to the power drawn from the PoE supply, which is about 71 W (permissible peak power).

FIG. 4c) shows the intermediate circuit voltage $V_{DCL}$ at the energy storage element 340. The intermediate circuit voltage $V_{DCL}$ is generated by the upconverter and rises during an initial time period of about 300 ms to an operating value of 200V. The corresponding charging current as shown in FIG. 4b) is limited such that the total current drawn from the network is not more than 1.92 A, which is the permissible limit for the network. Optionally, the speed of recharging the energy storage element 340 can be adapted to the state of charge in that slower recharging can be set in the event of only low discharge. In this case, the charging current is reduced as soon as the voltage level reaches e.g. 90% or 85% of the operating voltage. For the remaining 10% or 15% respectively of the charging, the charging current may optionally be controlled to be in proportion to the difference between maximum and current charging voltage of the energy storage element 340. This has the advantage of reducing losses on the feed line, since these depend on the square of the current on the feed line. At t=1.0 s, the power $P_{Load}$ which is provided to the audio amplifier 360 or the transducer respectively, rises as mentioned above. However, this additional power is not drawn from the energy source (i.e. the network) directly, but from the energy storage element 340. Thus, the intermediate circuit voltage $V_{DCL}$ drops to a value of about 60V, which is still above the supply voltage of 48V delivered by the energy source (see FIG. 4c)).

Simultaneously, the energy storage element 340 is recharged with the charging current $I(R_1)$ shown in FIG. 4b), wherein again the total current of 1.92 A permissibly drawable from the network is not exceeded. This may be ensured by a limitation of the current. Accordingly, the supply voltage $V_{PSE}$ does not collapse (see FIG. 4c), and the power $P_{NW}$ drawn from the network remains within the permissible range at a maximum of about 71 W (see FIG. 4d). In particular, the network is not loaded with impulsive power peaks.

The energy storage element 340 in this example is dimensioned so that a pulse power of approximately 162 $W_{eff}$ can be provided to the consumer for a duration of approximately 200 ms, which is sufficient in particular for many audio applications. This duration may be increased by increasing the capacitance or by increasing the intermediate circuit voltage, for example. Already about 500 ms after the beginning (or about 300 ms after the end) of this power impulse, the energy storage element 340 is fully recharged again, so that it may provide another power impulse e.g. of the same magnitude. The consumer or load in this example consumes only very low or practically no power during this time. In other cases, the recharging may take longer. Accordingly, the power supply unit 320 should be dimensioned so that particularly high impulse loads to not occur too often. With voltage and maximum current of the energy source being predetermined, as in the case of PoE, possible parameters for dimensioning the power supply unit 320 may be, for example, the charging voltage or intermediate circuit voltage $V_{DCL}$ respectively, and the capacitance $C_{DCL}$ of the energy storage element 340. Exemplarily, the above-mentioned time values may be achieved with a charging voltage of $V_{DCL}$=200V and a capacitance of $C_{DCL}$=1000 µF. Further, for some applications it may be sufficient to be able to bridge only a duration $t_d$ of e.g. 100 ms or 150 ms.

It is important that the charging voltage or intermediate circuit voltage $V_{DCL}$ is significantly higher than the input voltage $V_{PSE}$ received from the energy source and also significantly higher than the output voltage $V_C$ provided to the consumer, i.e. $V_{DCL}=x_1*V_{PSE}$ and $V_{DCL}=x_2*V_C$ with $x_1, x_2 > 1$. The two factors $x_1, x_2$ may be equal or may differ from each other. Advantageous are factors $x_1, x_2$ that are at least 2, and in particular for network operated loudspeakers factors that are in the range $x_1, x_2$=4, . . . , 6 (e.g. $x_1$=4.2, $x_2$=5.7, like in the above example). Generally also a higher factor may be advantageous, depending on the respective application. However, the higher the intermediate circuit voltage is, the higher may also be the losses in the voltage converters and/or in the energy storage element 340. Further, electronic components that are specified for higher voltages, i.e. with higher dielectric strength, are more expensive. For example, the required pulse power and pulse length, the recovery time or repetition rate of the pulse power and the available charging current are to be considered for dimensioning the power supply unit 320.

Figure 5:
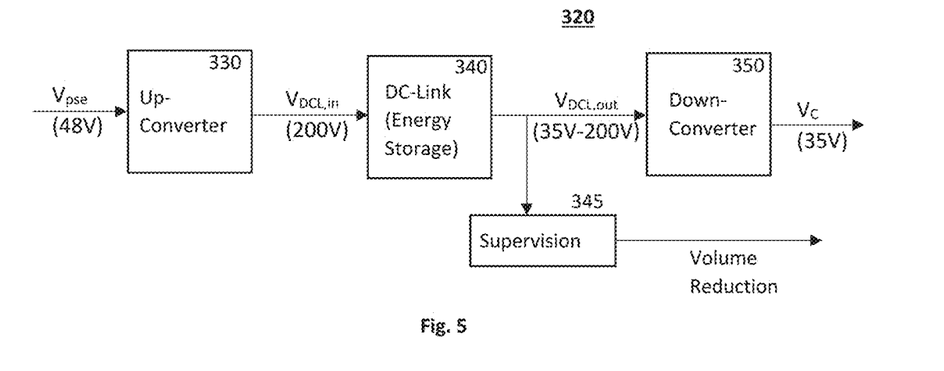
FIG. 5 shows a block diagram of a power supply unit.

FIG. 5 shows a power supply unit 320, in an embodiment, with an upconverter 330, an energy storage element 340 and a downconverter 350. The upconverter 330 generates from the input voltage $V_{PSE}$=48V the intermediate circuit input voltage $V_{DCL,in}$=200V, or the required current for charging the energy storage element 340 to this voltage respectively. The intermediate circuit output voltage $V_{DCL,out}$ provided by the energy storage element 340 is converted down to the output voltage $V_C$=35V by the downconverter 350. The energy storage element 340 may comprise one or more capacitors and/or accumulators. In a simple case, it is a single capacitor, wherein in that case $V_{DCL,in}=V_{DCL,out}$ may apply. The filling level of the energy storage element 340 and thus the provided intermediate circuit output voltage $V_{DCL,out}$ may vary, as described above. It may be in a range of 48V-200V, for example. Depending on the downconverter 350, the intermediate circuit output voltage $V_{DCL,out}$ may temporarily also be lower than the input voltage. For example, it may be in a range of 35V-200V.

Figure 6:
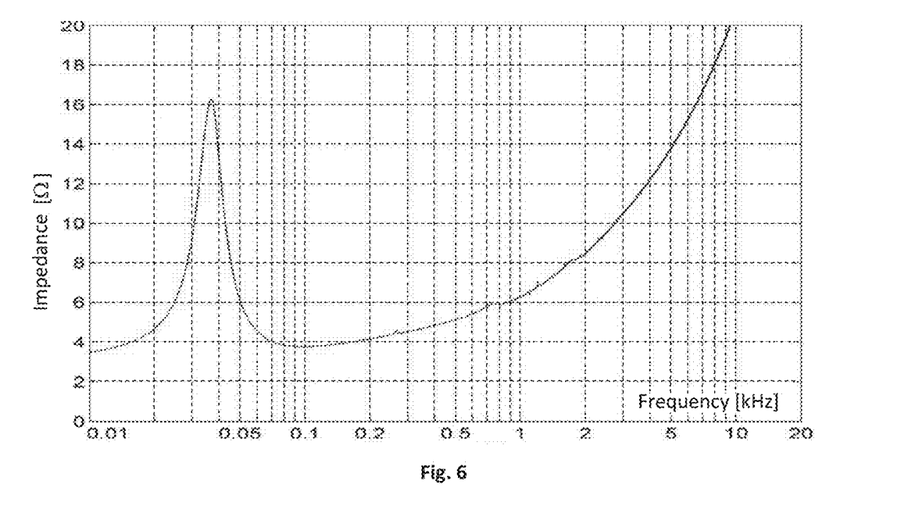
FIG. 6 shows the frequency-dependent impedance of a loudspeaker.

A further advantage of the present disclosure is that a precise and very simple measurement of the actual value of the power that the loudspeaker consumes is enabled. The power may then be limited by means of a limiter. Conventionally, the design of classical limiters uses the minimum impedance of the loudspeaker (i.e. transducer) as a constant value for calculating the limiter threshold. However, this approach does not consider that the impedance of the loudspeaker is variable and frequency dependent: apart from an impedance peak at the resonance frequency (especially if the loudspeaker is mounted within a housing, as exemplarily shown in FIG. 6), the impedance increases also for higher signal frequencies, thereby becoming significantly higher than the minimum value, as also shown in FIG. 6. As a result, the power that the loudspeaker consumes drops sharply. The transducer impedance rises also if the coil within the loudspeaker heats up due to power consumption. Limiters are usually designed for the minimum impedance of the loudspeaker, and therefore more restrictive than necessary. For example, a limiter for a loudspeaker having an impedance curve as shown in FIG. 6 would typically be designed for the minimum impedance of 4 Ohms (at approximately 100 Hz). With the present invention, an improved design or improved control of the limiter is possible, based on the power that is actually consumed. A determination of the current and voltage at the loudspeaker with subsequent analog-to-digital conversion, which is alternatively possible, would theoretically deliver the same result, but is much more complicated to perform. Also the design and cost of the measuring electronics would in practice be disadvantageous.

In an embodiment, the power supply unit 320 may not only deliver the increased pulse power, as described above, but also measure and/or supervise the total power delivered to the consumer. For this purpose, a supervision unit 345 monitors e.g. the intermediate circuit voltage $V_{DCL,out}$ and thereby detects any withdrawal of energy from the energy storage element 340. By integrating over time (for example a second or a minute), this can be used for simply measuring the power that the consumer absorbs. Further, any excessive energy consumption can be detected, which indicates an overload of the energy source and/or of the consumer. In this case, the voltage supply or energy supply for the consumer can be reduced. It is also possible to generate a (hardware or software) control signal Ctrl which indicates an excessive energy consumption and/or with which the connected consumer, in this case the audio amplifier 360, can be regulated accordingly in order to absorb less energy. In particular, the regulation may be such that, on average, the consumer does not absorb more energy than the energy source can supply. For example, the control signal Ctrl may be used to control a visual indication that indicates an overload of the energy source to the user. Alternatively, the (hardware or software) control signal Ctrl may be used to regulate the connected device in such a way that it absorbs at least for a certain period of time less energy than the energy source may provide. During this time, the system may recover, for example the energy storage element 340 may be recharged, the load (i.e. consumer) may cool down again and so forth.

A further advantage of the invention is thus that it enables a very precise measurement of the energy fed into the load as a function of time, at least for high values. The energy may simply be obtained from the voltage curve $V_{DCL}(t)$ of the DC-link, whereby all negative energy components $\Delta E(t_{i+1})$ are fed into the load and contribute to its warming up: $\Delta E=(t_{i+1})=\frac{1}{2} C[U^2(t_{i+1})-U^2(t_i)]$ or $\Delta P(t_{i+1})=\Delta E(t_{i+1})/(t_{i+1}-t_i)$ For example, this precise knowledge of the power fed into the loudspeaker enables for the first time a much more precise setting of the limiters or compressors respectively, and thus a further increase in sound pressure at the same size of the loudspeakers. Based on the total energy fed in, a total limiter or sum limiter can, for example, limit the overall system, which can include several loudspeakers. Until now, the effect of the limiters had to be derived from the voltage signal curve. However, since the load impedance of the loudspeaker fluctuates strongly depending on the frequency, and moreover these curves also vary depending on the temperature and the deflection of the loudspeaker membrane, conventional simple methods can determine the effective power converted into heat only in a very rough approximation. Based on the measurement of the power fed into the loudspeaker as disclosed herein, it is much easier to control an automatic protection circuit which protects the loudspeaker and/or the amplifier (or generally the consumer) from overload.

Figure 7:
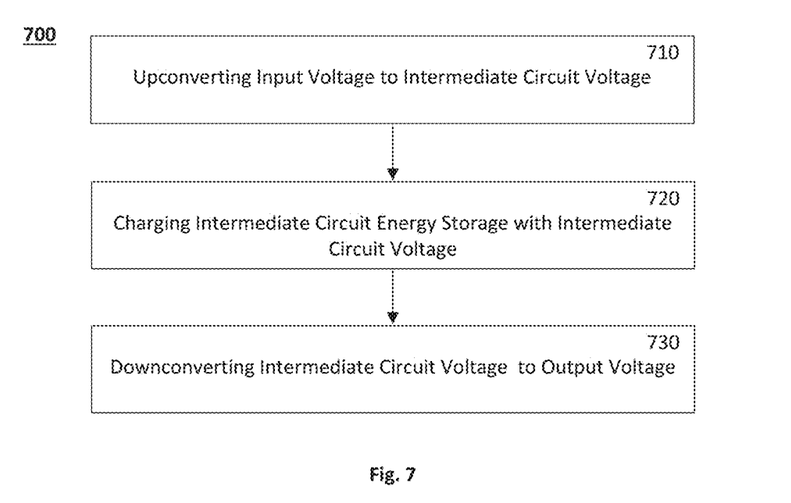
FIG. 7 shows a flow-chart of a method, according to an embodiment.

In one embodiment, the invention relates to a method for supplying energy or voltage respectively from an energy limited or current limited source to an electrical circuit. FIG. 7 shows a corresponding flow chart. The method 700, which is automatically executed by a power supply unit 320, comprises steps of upconverting (i.e. transforming) 710 an input voltage up to an intermediate circuit voltage or DC-link voltage $V_{DCL}$, charging 720 an intermediate circuit energy storage element 340 to the intermediate circuit voltage $V_{DCL}$, and downconverting (i.e. transforming) 730 the intermediate circuit voltage $V_{DCL}$ down to an output voltage. The downconverting 730 may provide at least for a certain period of time an amount of power that is higher than the amount of power that the upconverting 710 provides within the same period of time, for example as pulse power. The product of power and time is energy, so that, in other words, the power supply unit 320 may deliver more energy during said certain period of time for downconverting 730 than it receives by upconverting 710 during the same period of time. During this period of time, the additionally delivered energy is taken from the intermediate circuit energy storage element or DC-link 340. The energy storage is then recharged after said period of time. As shown in the example in FIG. 4c, a further withdrawal of energy may also occur already before reaching the maximum intermediate circuit voltage. In FIG. 4, the intermediate circuit voltage $V_{DCL}$ is reduced with each power half-wave between t=1.0 s and t=1.2 s, which leads to the stepped curve in this period of time.

As described above, an excessive withdrawal of energy can be detected. This may be done by measuring the current intermediate circuit voltage $V_{DCL}$ and automatically determining, from the measured momentary intermediate circuit voltage $V_{DCL}$, an amount of energy that is withdrawn from the intermediate voltage storage element 340 during its discharging. The determined amount of energy, or a temporal mean or total value of the energy amount calculated from it, is compared with a threshold and a control signal Ctrl is automatically generated which indicates an exceedance of the threshold and/or which can be used to reduce the output voltage, for example. The temporal mean or total value of the energy amount is calculated over a longer period of time, that is, at least longer than a single full discharging cycle $t_d$ may take.

Figure 8:
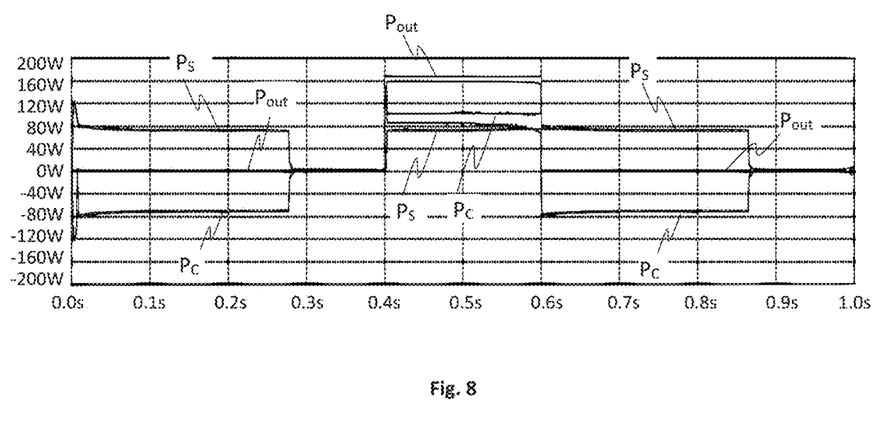
FIG. 8 shows a power diagram.

FIG. 8 shows curves of the (effective) power within the power supply unit 320 exemplarily for a pulse-like load that lasts 200 ms. In particular, the power $P_S$ at the output of the upconverter 330, the power $P_C$ at the energy storage element 340 and the power $P_{out}$ delivered at the output are depicted, as resulting from a transient simulation in the time domain of a switching regulator with internal switching frequency. This differs from the frequently used AC simulation, in which switching regulators are modeled by linearized elements (Gain, R, C, L), since it is more realistic. During the first approx. 280 ms after power-on, the upconverter 330 delivers a power $P_S$ that is stored in the energy storage element 340. Thus, the power $P_C$ of the energy storage element 340 is negative during this period of time. At approx. t=280 ms, the energy storage element 340 is fully charged and the power $P_S$ of the upconverter 330 decreases to (practically) zero since it has no load anymore. Also the power $P_C$ that the energy storage element 340 stores goes back to zero. Until this time, a connected consumer requires practically no power ($P_{out}\approx0$). At t=0.4 s, a load phase begins that takes 200 ms and during which the power $P_{out}$ is delivered to the consumer. Herein, a very high value of $P_{out}$=162 W is reached, which is a sum of the power $P_S$ delivered by the upconverter 330 and the power $P_C$ delivered by the energy storage element 340. Both deliver approx. 70-90 W each, wherein the portion of power $P_C$ that is delivered by the energy storage element 340 is even higher ($P_C$>$P_S$). In the depicted example, the load phase by the consumer essentially ends after 200 ms at t=0.6 s ($P_{out}$≈0), but the upconverter continues to deliver power ($P_S$>0) in order to recharge the energy storage element 340 ($P_C$<0), as in the beginning. The upconverter may also deliver a small amount of power that the consumer continues to consume. It is advantageous that the power $P_S$ delivered by the upconverter 330, which also corresponds to the power withdrawn from the energy source, is never higher than a permitted maximum value of approx. 71 W (in this example). As can be seen here, the solution according to the invention makes it possible to deliver, at least for a certain period of time, a significantly higher power to a consumer than the energy source could, without the energy source being excessively loaded.

Figure 9:
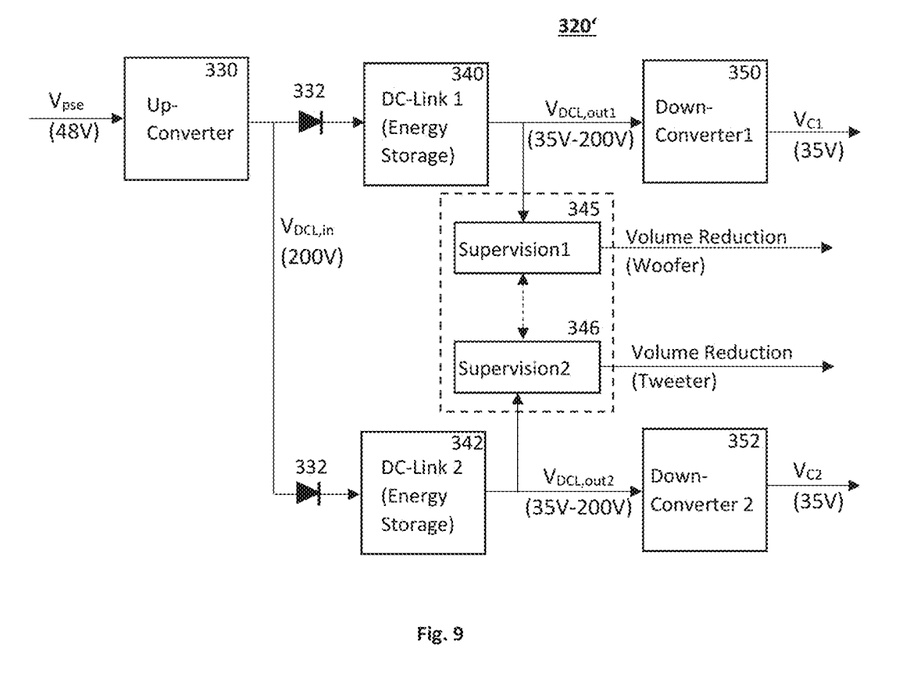
FIG. 9 shows a block diagram of a power supply unit for a two-way speaker, in a first embodiment.

The above-described power measurement may also be further differentiated. For example, a plurality of DC-links may be used to distribute the stored energy in the case of multi-way speaker boxes. In a first embodiment and by way of example, FIG. 9 shows a block diagram of such a power supply unit 320' which supplies power to a two-way box by means of PoE. The intermediate circuit voltage $V_{DCL,in}$ generated by the upconverter 330 supplies two separate energy storage elements 340,342. The two energy storage elements 340,342 generate two separate intermediate circuit voltages $V_{DCL,out1}$, $V_{DCL,out2}$ which are used to supply two separate downconverters 350,352. Thus, the two energy storage elements 340, 342 each provide a voltage $V_{C1}$,$V_{C2}$ via the respective downconverter to a branch of the two-way box, either the low-frequency branch (woofer) or the high-frequency branch (tweeter). Both intermediate circuit voltages $V_{DCL,out1}$, $V_{DCL,out2}$ may be supervised separately as described above. This may be done in separate supervision units 345,346 that each may generate control signals for reducing the power consumption of the respective loudspeaker. Optionally, the two supervision units 345,346 may be integrated into a single supervision unit and/or may communicate with each other via signals so that, for example, not only the volume of the woofer is reduced when a power limit in the woofer is exceeded, but also the volume of the tweeter. However, the degree of volume reduction may differ in both branches. In order to prevent an undesired mutual interference of the two jointly supplied energy storage elements 340,342, a corresponding protective circuit 332 can be provided, for example simple diodes.

Figure 10:
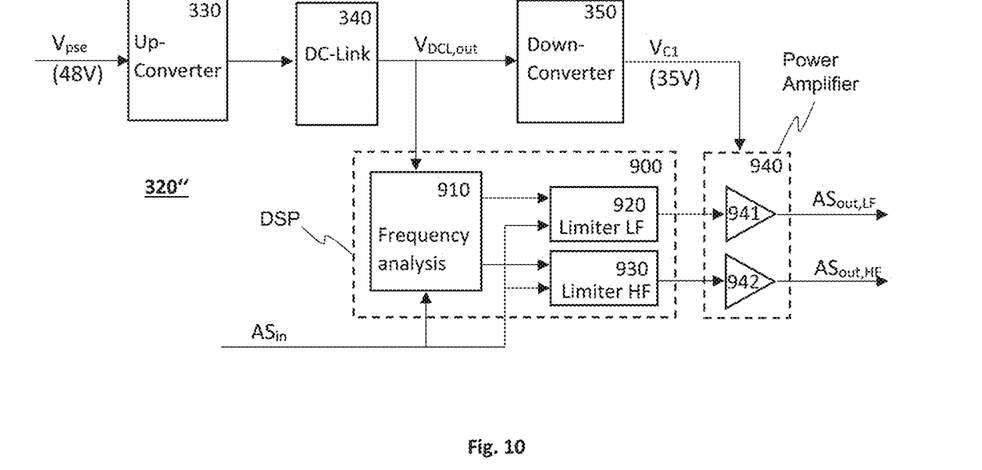
FIG. 10 shows a block diagram of a power supply unit for a two-way speaker, in a second embodiment.

In principle, the distribution of the energy shares to the individual branches (e.g. tweeter, woofer) is also possible when using a single energy storage element 340. This is advantageous because the energy storage elements (especially for high intermediate circuit voltages) are expensive. FIG. 10 shows a block diagram of a power supply unit 320" for a two-way box, in a second embodiment. The intermediate circuit voltage $V_{DCL,out}$ is fed to a downconverter 350 which converts it into a common supply voltage $V_{C1}$ for a power output stage 940, in this example. The power output stage 940 comprises separate amplifier paths 941,942 for low frequencies and high frequencies, and generates the corresponding audio signals $AS_{out,LF}$, $AS_{out,HF}$ for the woofer and the tweeter from audio signals that it receives from the respective limiters 920,930. Further, the intermediate circuit voltage $V_{DCL,out}$ is fed to a frequency analysis block 910. The frequency analysis block 910 analyzes the audio input signal $AS_{in}$ to be replayed, which is also provided to the limiters 920,930. The frequency analysis block 910 can therefore detect precisely which amount of energy is provided overall and which proportions of the output power are consumed in the tweeter and in the woofer. Accordingly, the frequency analysis block 910 can control the limiters 920,930 separately. Thus, the power withdrawn from the energy storage element 340 can be separated according to the frequency range and be assigned to the corresponding power output stages 941,942 or the loudspeakers, respectively.

Figure 11:
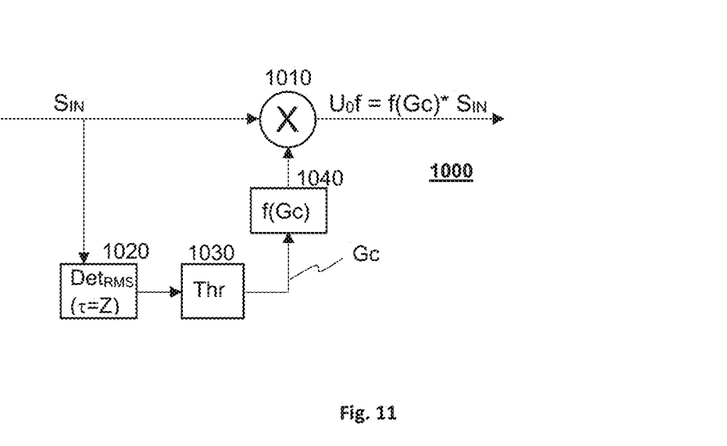
FIG. 11 shows a general block diagram of an audio limiter.

FIG. 11 shows a general block diagram of a known audio RMS limiter 1000 (analog or digital), with a signal path in the upper part and a control and detector path in the lower part. In the control and detector path, the input audio signal $S_{IN}$ is fed into an RMS detector 1020 having a time constant τ=Z. The RMS detector 1020 determines the RMS value or effective value of the audio signal over a time period Z. The determined RMS value is passed on to a threshold detector 1030, which compares it to one or more predefined threshold values Thr. If a threshold value is exceeded, this is indicated by a signal Gc that controls a gain function f(Gc) in a gain factor generator 1040 that generates a gain factor f(Gc). The generated gain factor f(Gc) is then applied by the multiplier 1010 to the input audio signal $S_{IN}$. As long as the RMS value of the audio signal is below the threshold value for a duration of the time period Z, the audio signal is passed through to the output unchanged. Upon exceeding the threshold value Thr, the RMS value of the audio signal is multiplied with a gain factor f(Gc)<1 and thus reduced. In the steady state, the RMS value of the output signal $U_o$f corresponds to the threshold value Thr. With an appropriate design, this output signal leads to a continuous output power in the power amplifier output stage with which the loudspeaker can be operated without time limit. The change of the gain factor f(Gc) is continuous and subject to a defined behavior over time. The control signal for the RMS detector 1020 needs not be derived only from the input signal; alternatively, it may also be derived from the output signal, wherein in this case the function f(Gc) is different.

Figure 12:
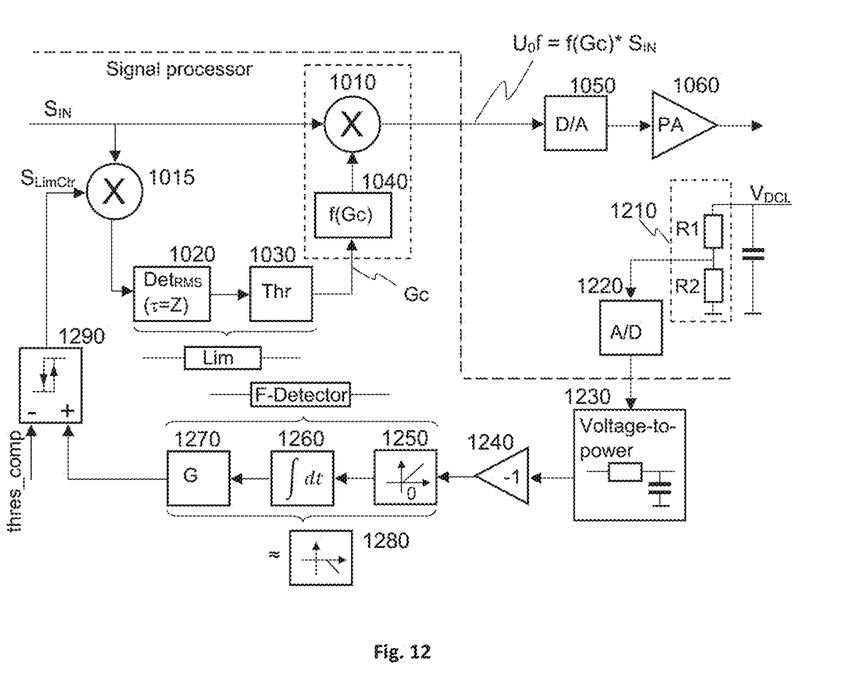
FIG. 12 shows a block diagram of an audio limiter with improved regulation, in an embodiment.

FIG. 12 shows a block diagram of an audio RMS limiter with a regulation that is improved according to a first embodiment of the invention. The improved regulation is based on the above-described DC-link, which is shown here only schematically as a capacitance. In particular, the control and detector path of the above-described general form of an audio RMS limiter is enhanced by considering the filling level of the energy storage element. This is achieved by generating a control signal from the current intermediate circuit voltage $V_{DCL}$ by running it through a voltage divider 1210 and an A/D converter 1220. As a result, the current state of charge of the energy storage element or the DC-link capacitor respectively is available in the digital signal processing at any time. The digitized control signal is converted into a limiter control signal $S_{LimCtr}$ by an adapter circuit 1230,1240, a second limiter 1280 with a higher integration time and a comparator 1290 with a hysteresis. The limiter control signal $S_{Limctr}$ is fed to the multiplier 1015 which was inserted in the detector path 1020-1040 of the audio RMS limiter and which can only assume the values 1 and 0, thus activating or deactivating the audio RMS limiter. The remainder of the control and feedback path may remain unchanged. The output signal $U_o$f of the audio RMS limiter is provided via a D/A converter 1050 and a power amplifier 1060 to loudspeakers (i.e. transducers), as usual.

The adapter circuit 1230-1240, the second limiter 1280 and the comparator 1290 constitute an improved feedback path of the regulation. In particular, the momentary value of the charging or discharging power of the energy storage element 340 is continuously calculated 1230 from the current intermediate voltage $V_{DCL}$. The calculated value is inverted 1240 and then smoothed by a low-pass function 1260 and amplification functions 1250,1270. The low-pass function 1260 may be implemented as an integrator that optionally may use different time constants for upwards and downwards integration. The resulting signal is fed to a comparator 1290 that compares it to a threshold value thres_comp. When the threshold is exceeded, the audio RMS limiter is activated and the amplitude of the output signal $U_O f$ is reduced. The regulation ensures, however, that the audio RMS limiter is not activated immediately, but only after a certain time, as described further below. By decoupling the temporal behavior of the DC link discharging and the audio RMS limiter, clipping of the audio output signal is prevented, despite the running regulation, and thus the distortion factor improved. The above-described blocks 1010-1040, 1230-1290 for the digital signal processing can be implemented by one or more signal processors, for example.

Figure 13:
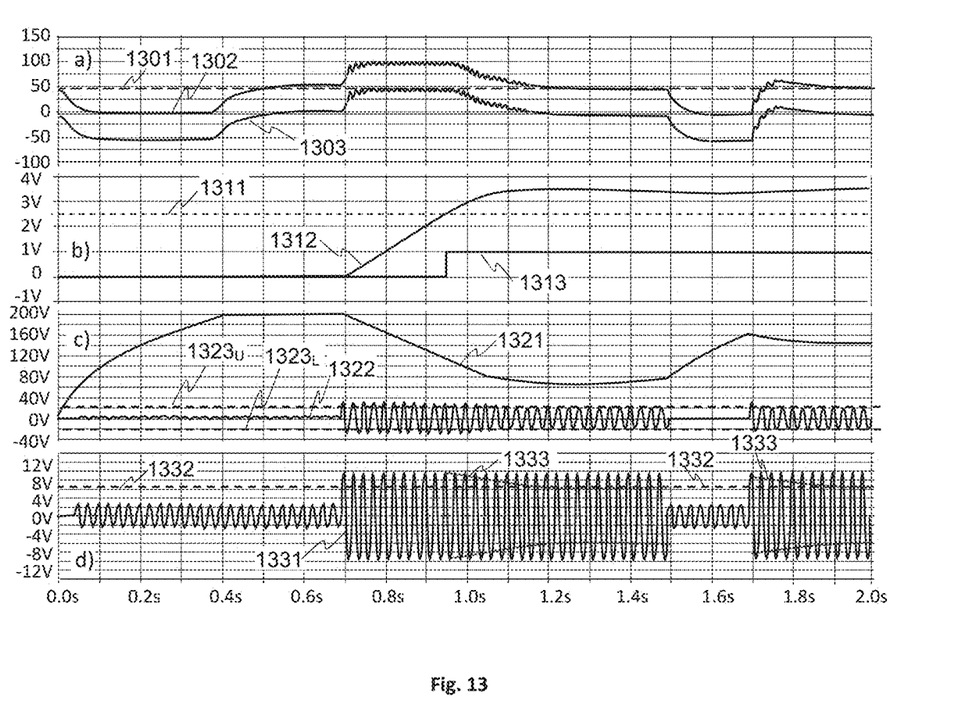
FIG. 13 shows simulated signal curves in the audio limiter with improved regulation and simplified load impedance.

FIG. 13 shows simulated signal curves in the audio limiter with improved regulation and simplified load impedance. The above-described DC-link is used here to supply a loudspeaker with a (peak) power of 100 W for 200 ms, while the power available via PoE from a network is limited to only 50 W here. This corresponds here also to the threshold value Thres_LS of the loudspeaker, since it can convert a continuous power of 50 W. The limiter regulates the audio power 1302 within 500 ms from 100 W down to the threshold 1301 of 50 W, as shown in the upper curve of FIG. 13 *a*). Initially, until approximately 0.5 s after power-on, the DC-link or the energy storage element 340 respectively is charged, so that its power 1303 is negative. During this time, the voltage 1321 of the DC-link (see FIG. 13 *c*)) rises until approx. 200V. From t=0.7 s, a high input voltage 1331 (see FIG. 13 *d*)) is applied to the limiter, so that the output power 1302 increases sharply and the DC-link or the energy storage element 340 emits energy (curve 1303). FIG. 13 *b*) shows the simulated voltage curve 1312 at the output of the integrator 1260 and the simulated voltage curve 1313 at the output of the comparator 1290. As soon as the voltage 1312 at the output of the integrator 1260 exceeds the threshold thres_comp 1311 at approx. t=0.95 s, the output voltage 1313 of the comparator 1290 indicates this, thus switching the limiter on. At this time, the DC-link has already been emitting energy to the audio amplifier for 0.25 s, so that its voltage 1321 has been falling since then. As shown in FIG. 13 *d*), the limiter reduces its output voltage 1333 gradually over the next 200 ms, so that it is below the permissible limit 1332 again at approx. t=1.2 s. Correspondingly, the audio output voltage 1322 at the loudspeaker is returned to the permissible range within the limits 1323$_U$, 1323$_L$ and the output power 1302 falls to or below the threshold 1301 again. Thus, a brief overload of the loudspeaker is possible, but an overheating as well as sudden signal jumps are avoided after a short time by gradually reducing the voltage and thereby the volume.

Since all the energy that can be drawn from the network is used for the audio signal, the DC-link is not yet recharged. The energy storage of the DC-link is only charged again at approx. t=1.5 s when the input voltage 1331 is below a threshold value again. The regulation is adjusted in such a manner that the voltage of the DC-link does not fall below 60V. At a subsequent increase of the input voltage 1331 at approx. t=1.7 s, the DC-link is not yet fully charged again, so that the regulation now reacts immediately and reduces the audio output voltage 1322 to values within the limits 1323$_U$, 1323$_L$. At this time, the charging voltage 1321 of the DC-link does not rise any further yet, since there is no energy left over for this.

In FIG. 13 *d*) it is to be noted that the input voltage and the output voltage 1331 of the limiter are largely identical. Differences only result from the fact that, starting at approx. t=1.2 s, the output voltage is within the limits 1333 and therefore lower than the input voltage. However, this is difficult to see in the diagram since the load impedance is simplified and thus the phases are equal. This applies to the time periods at about t=0.95 s-1.5 s and t=1.7 s-2.0 s.

Figure 14:
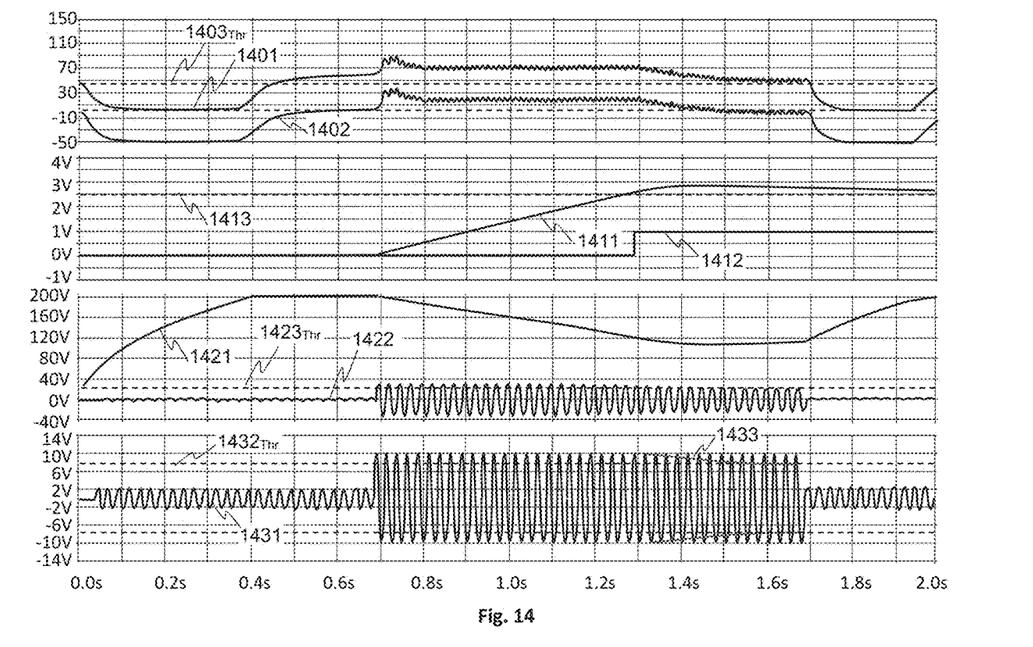
FIG. 14 shows simulated signal curves in the audio limiter with improved regulation and realistic load impedance.

As mentioned above, the loudspeaker impedance is simplified as an ohmic resistor of 4 Ohms in FIG. 13. If the impedance of the loudspeaker is assumed to be for example 6 Ohms for an operating frequency slightly away from the minimum impedance frequency, then the capacitor of the DC-link is less discharged. FIG. 14 shows simulated signal curves in the audio limiter with an improved regulation and a realistic load impedance of 6 Ohms. Again, the upper curve 1401 represents the total audio power compared to the threshold 1403$_{Thr}$, the second curve represents the voltage 1411 at the integrator output and the voltage 1412 at the comparator output, the third curve 1421 represents the charging state of the DC-link and the audio voltage 1422 at the loudspeaker, and the fourth curve represents the input and output voltages 1431 of the limiter. In principle, the regulation is performed as described above, except that the limiter reduces the output power to 50 W at approx. t=1.4 s, so only after a period of about 0.8 s with higher power consumption. This will not damage the loudspeaker neither distort the audio signal. The power reduction cannot be heard directly by the user; in particular no audible artifacts are produced.

Figure 15:
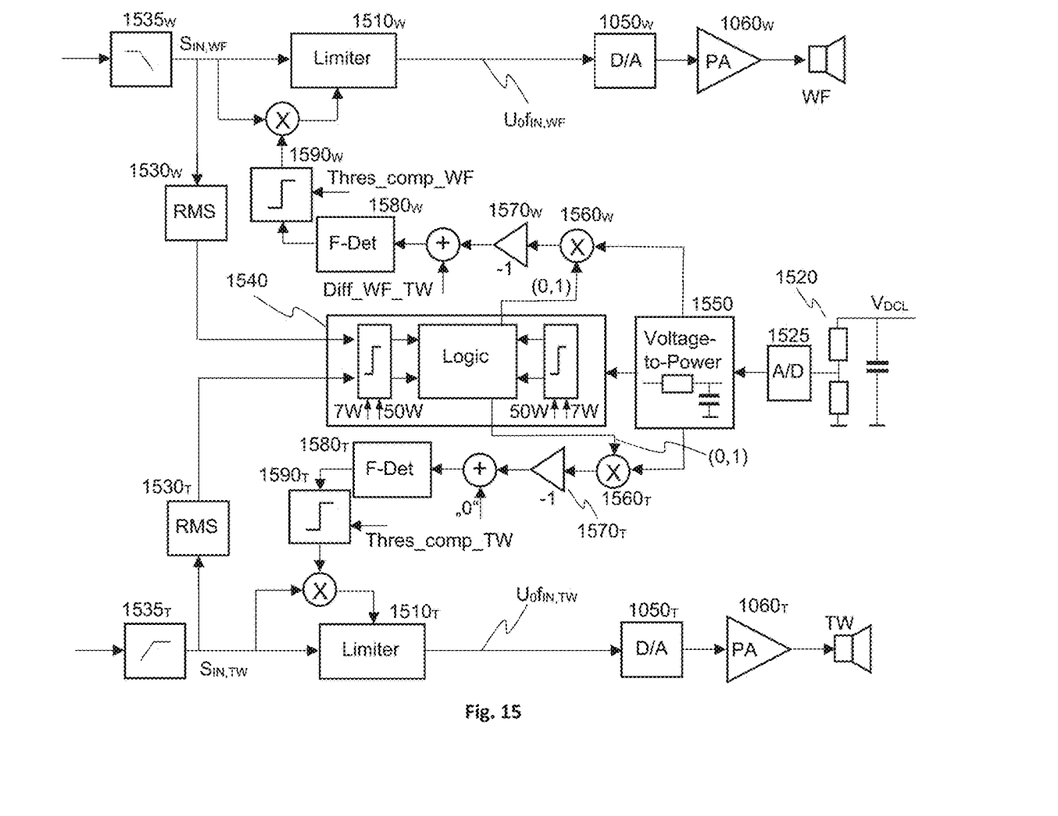
FIG. 15 shows a block diagram of a power supply unit for a two-way speaker, in an embodiment.

The DC-link can also be applied in multi-way speaker boxes. FIG. 15 shows, in an embodiment, a block diagram of a power supply unit for a two-way speaker. It uses a high-pass 1535$_T$ and a low-pass 1535$_W$ to generate the input audio signals $S_{IN,WF}$, $S_{IN,TW}$ for the (low-frequency) woofer WF and the (high-frequency) tweeter TW, respectively. The input audio signals $S_{IN,WF}$, $S_{IN,TW}$ pass through respective dynamically controlled limiters 1510$_W$, 1510$_T$ and are then converted 1050$_W$, 1050$_T$ back from digital into analog signals, which are finally amplified by power amplifiers 1060$_W$, 1060$_T$. The blocks 1560-1590 for controlling the limiters are in principle as described above. It is assumed that the energy provided by the DC-link 1520 (depicted schematically here) is consumed either by the woofer WF or the tweeter TW, or both. For this purpose, the RMS values of the signals on both paths are determined separately 1530$_T$,1530$_W$ and compared 1540 to a corresponding threshold value Thres_LS of the audio signal, which in this example may be 7 W or 50 W. First, if the threshold is exceeded in one of the audio paths, the activation of the limiter 1510$_W$, 1510$_T$ in the respective other audio path is blocked. Only if the "side chain limiter" exceeds the threshold in both audio paths, and if simultaneously the DC-link is discharged (or incompletely charged, respectively), both limiters are activated. This solution makes it possible to obtain the above-mentioned advantages for each branch of the multi-way box separately.

It should be noted that the terms two-way box, two-way speaker and two-way speaker box are used as synonyms herein and refer to corresponding loudspeaker boxes. The same applies to the terms multi-way box, multi-way speaker and multi-way speaker box.

Although the above-described embodiments refer to loudspeaker boxes that receive their supply power from a data network (especially LAN according to IEEE802.3x or Ethernet, respectively), the present invention can be used more generally. For example, the invention can be used to supply energy from a power-limited energy source to any device. The power-limited energy source may be, for example, a device that in turn is supplied with energy from a network, such as for example a power adapter connected to an AC voltage, or it may comprise one or more accumulators. Also the energy storage element 340 may comprise one or more accumulators. However, it must be taken into account that in the case of audio signals it may be required to carry out a very high number of charging and discharging cycles, corresponding to the impulsive nature of the audio signals, which may be disadvantageous for Li-Ion accumulators, for example. Further, the invention may be used advantageously for a precise measurement of power consumption and/or a power-based regulation. This is particularly advantageous for inductive, capacitive or any non-linear power consuming devices or loads since their power consumption is otherwise difficult to determine.

As far as it is useful and technically possible, various of the exemplary embodiments described above can be combined with one another, even if such combination is not expressly mentioned.

What is claimed is:

1. A device for measuring a power consumption of an electrical circuit, the device comprising
   an upconverter adapted for converting the first supply voltage from an energy source up to an intermediate circuit voltage that is higher than the first supply voltage; an energy storage element adapted for being charged to the intermediate circuit voltage by the upconverter;
   a downconverter adapted for converting the intermediate circuit voltage down to a second supply voltage for the electrical circuit; and
   a supervision unit adapted to monitor the intermediate circuit voltage;
   wherein the upconverter is configured to draw a first amount of power from the energy source;
   wherein the downconverter is configured to provide a second amount of power to the electrical circuit that is higher than the first amount of power at least for a defined period of time; and
   wherein the downconverter is configured to draw power from the energy storage element during said defined period of time, wherein the intermediate circuit voltage is reduced;
   wherein the supervision unit is configured to measure the current intermediate circuit voltage and automatically determine an amount of energy drawn from the intermediate circuit energy storage during the defined period of time based on the measured current intermediate circuit voltage and to determine the power consumption of the electrical circuit based on the determined amount of energy and the defined period of time.

2. The device according to claim 1, wherein the energy storage element comprises one or more capacitors.

3. The device according to claim 1, wherein the energy storage element comprises one or more accumulators.

4. The device according to claim 1, wherein the first supply voltage and the second supply voltage are DC voltages.

5. The device according to claim 4, wherein the energy source for proving the first supply voltage is connectable to a data network, in particular a local area network, or a device connected to such data network.

6. The device according to claim 4, wherein the intermediate circuit voltage is at least twice the first supply voltage.

7. The device according to claim 6, wherein the intermediate circuit voltage is at least four times as high as the first supply voltage, and the first supply voltage is higher than the second supply voltage.

8. The device according to claim 1, wherein the defined period of time is between 100 ms and 200 ms and wherein during this period of time the second amount of power provided to the electrical circuit is about twice the first amount of power drawn from the energy source.

9. The device according to claim 1, wherein the supervision unit is configured to
   compare the determined amount of energy, or a temporal mean value or a total value of the amount of energy calculated therefrom, with a threshold value over a second period of time that is longer than the defined period of time; and
   automatically generate a signal which indicates that the threshold value has been exceeded.

10. The device according to claim 9, wherein the signal which indicates that the threshold has been exceeded is used for automatically reducing the power supply of the electrical circuit.

11. The device according to claim 10, wherein the reduction of the power supply is automatically terminated if said signal indicates that the threshold has not been exceeded for a defined minimum duration.

12. A loudspeaker box having a network connector, an amplifier circuit and a device according to claim 1, wherein the loudspeaker box may receive the first supply voltage via the network connector and wherein the electrical circuit is said amplifier circuit.

13. A method for measuring a power consumption of an electrical circuit, the method being executed by a power supply unit and comprising steps of:
   upconverting an input voltage received from an energy source to an intermediate circuit voltage that is higher than the input voltage;
   charging an intermediate circuit energy storage to the intermediate circuit voltage;
   measuring the intermediate circuit voltage and downconverting the intermediate circuit voltage to an output voltage; wherein at least for a defined period of time an amount of power is provided to the electrical circuit that is higher than an amount of power drawn via the upconverting during the same period of time, and wherein during said defined period of time energy is drawn from the intermediate circuit energy storage, wherein the intermediate circuit voltage is reduced;
   measuring the current intermediate circuit voltage and automatically determining an amount of energy drawn from the intermediate circuit energy storage during the defined period of time from the measured current intermediate circuit voltage; and
   determining the power consumption of the electrical circuit based on the determined amount of energy and the defined period of time.

14. The method according to claim 13, wherein the first supply voltage and the second supply voltage are DC voltages, wherein the intermediate circuit voltage is at least twice the first supply voltage, and wherein the defined period of time is at least 100 ms.

15. The method according to claim 13, further comprising steps of:
   comparing the determined amount of energy, or a temporal mean value or a total value of the amount of energy calculated therefrom, with a threshold value over a second period of time that is longer than the defined period of time; and
   automatically generating a signal which indicates that the threshold value has been exceeded.

16. The method according to claim 15, wherein the signal which indicates that the threshold has been exceeded is used for automatically reducing the power supply of the electrical circuit.

17. The method according to claim 16, wherein the reduction of the power supply is automatically terminated if said signal indicates that the threshold has not been exceeded for a defined minimum duration.

\* \* \* \* \*

UNITED STATES PATENT AND TRADEMARK OFFICE
CERTIFICATE OF CORRECTION

| | | |
|---|---|---|
| PATENT NO. | : 11,611,829 B2 | Page 1 of 1 |
| APPLICATION NO. | : 17/213368 | |
| DATED | : March 21, 2023 | |
| INVENTOR(S) | : Stephan Leschka et al. | |

It is certified that error appears in the above-identified patent and that said Letters Patent is hereby corrected as shown below:

In the Claims

In Claim 5, Column 14, Line 5, the word "proving" should corrected to read as --source for providing the first supply voltage in connectable to--.

Signed and Sealed this
Eighteenth Day of November, 2025

John A. Squires
*Director of the United States Patent and Trademark Office*